United States Patent
Sakaguchi (10) Patent No.: US 12,126,292 B2
(45) Date of Patent: Oct. 22, 2024

(54) MOTOR CONTROL DEVICE

(71) Applicant: DENSO CORPORATION, Kariya (JP)

(72) Inventor: Kouji Sakaguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 169 days.

(21) Appl. No.: 17/869,052

(22) Filed: Jul. 20, 2022

(65) Prior Publication Data

US 2022/0360207 A1 Nov. 10, 2022

Related U.S. Application Data

(63) Continuation of application No. PCT/JP2021/001582, filed on Jan. 19, 2021.

(30) Foreign Application Priority Data

Jan. 22, 2020 (JP) .................. 2020-008475

(51) Int. Cl.
*H02P 29/028* (2016.01)
*G01R 31/34* (2020.01)

(52) U.S. Cl.
CPC .......... *H02P 29/028* (2013.01); *G01R 31/343* (2013.01)

(58) Field of Classification Search
CPC . H02P 29/028; H02P 29/0243; G01R 31/343; F16H 61/32; F16H 63/34
USPC ................................. 318/466, 445
See application file for complete search history.

(56) References Cited

U.S. PATENT DOCUMENTS

| | | | | |
|---|---|---|---|---|
| 6,911,798 B2* | 6/2005 | Hori | ...................... | G01D 5/242 |
| | | | | 318/602 |
| 8,035,934 B2* | 10/2011 | Inoue | ...................... | F16H 61/12 |
| | | | | 318/446 |
| 8,766,589 B2* | 7/2014 | Takahashi | ........... | H02P 29/0243 |
| | | | | 318/823 |
| 2020/0224762 A1 | 7/2020 | Yamamoto et al. | | |

FOREIGN PATENT DOCUMENTS

| | | |
|---|---|---|
| JP | H9-23675 | 1/1997 |
| JP | 2011-182492 | 9/2011 |
| JP | 2012005286 A | 1/2012 |
| JP | 2013-118777 | 6/2013 |
| JP | 2014192950 A | 10/2014 |

* cited by examiner

*Primary Examiner* — David Luo
(74) *Attorney, Agent, or Firm* — Nixon & Vanderhye P.C.

(57) ABSTRACT

A motor control device controls a drive of a motor having a motor winding includes an angle calculation unit, a drive control unit, and an abnormality diagnosis unit. The angle calculation unit acquires a detected value from a rotation angle sensor that detects a rotation angle of the motor and calculate the rotation angle of the motor. The drive control unit controls the drive of the motor based on the rotation angle of the motor. When an abnormality in the rotation angle of the motor is detected while the motor is being driven, the abnormality diagnosis unit performs an abnormality diagnosis of an energized system while maintaining an energized state.

9 Claims, 9 Drawing Sheets

MOTOR CONTROL DEVICE

CROSS REFERENCE TO RELATED APPLICATIONS

This application is a continuation application of International Patent Application No. PCT/JP2021/001582 filed on Jan. 19, 2021, which designated the U.S. and based on and claims the benefits of priority of Japanese Patent Application No. 2020-008475 filed on Jan. 22, 2020. The entire disclosure of all of the above applications is incorporated herein by reference.

TECHNICAL FIELD

The present disclosure relates to a motor control device.

BACKGROUND

Conventionally, a shift range switching device for switching a shift range by controlling a drive of an actuator has been known.

SUMMARY

An object of the present disclosure is to provide a motor control device capable of appropriately detecting an abnormality.

The motor control device of the present disclosure controls a drive of a motor having a motor winding, and includes an angle calculation unit, a drive control unit, and an abnormality diagnosis unit. The angle calculation unit acquires a detected value from a rotation angle sensor that detects a rotation angle of the motor, and calculates the rotation angle of the motor. The drive control unit controls the drive of the motor based on the rotation angle of the motor. When an abnormality in the rotation angle of the motor is detected while the motor is being driven, the abnormality diagnosis unit performs an abnormality diagnosis of an energization system while maintaining the energized state.

BRIEF DESCRIPTION OF DRAWINGS

The above and other objects, features and advantages of the present disclosure will become more apparent from the following detailed description taken in conjunction with the accompanying drawings.

In the drawings.

DETAILED DESCRIPTION

In an assumable example, a shift range switching device for switching a shift range by controlling a drive of an actuator has been known. For example, a disconnection diagnosis is performed by an initial check before the shift range switching is performed.

In the above example, a failure that cannot be known without energization, such as an off failure of a switching element, is carried out at a timing when it is not necessary to drive the motor. Therefore, it is not possible to make a diagnosis when recovering from a temporary failure. An object of the present disclosure is to provide a motor control device capable of appropriately detecting an abnormality.

When an abnormality in the rotation angle of the motor is detected while the motor is being driven, the abnormality diagnosis unit performs an abnormality diagnosis of an energization system while maintaining the energized state.

Thereby, it is possible to appropriately distinguish whether the abnormality of the rotation angle of the motor generated during the motor drive is due to the abnormality of the rotation angle sensor or the abnormality of the energization system.

First Embodiment

Figure 1:
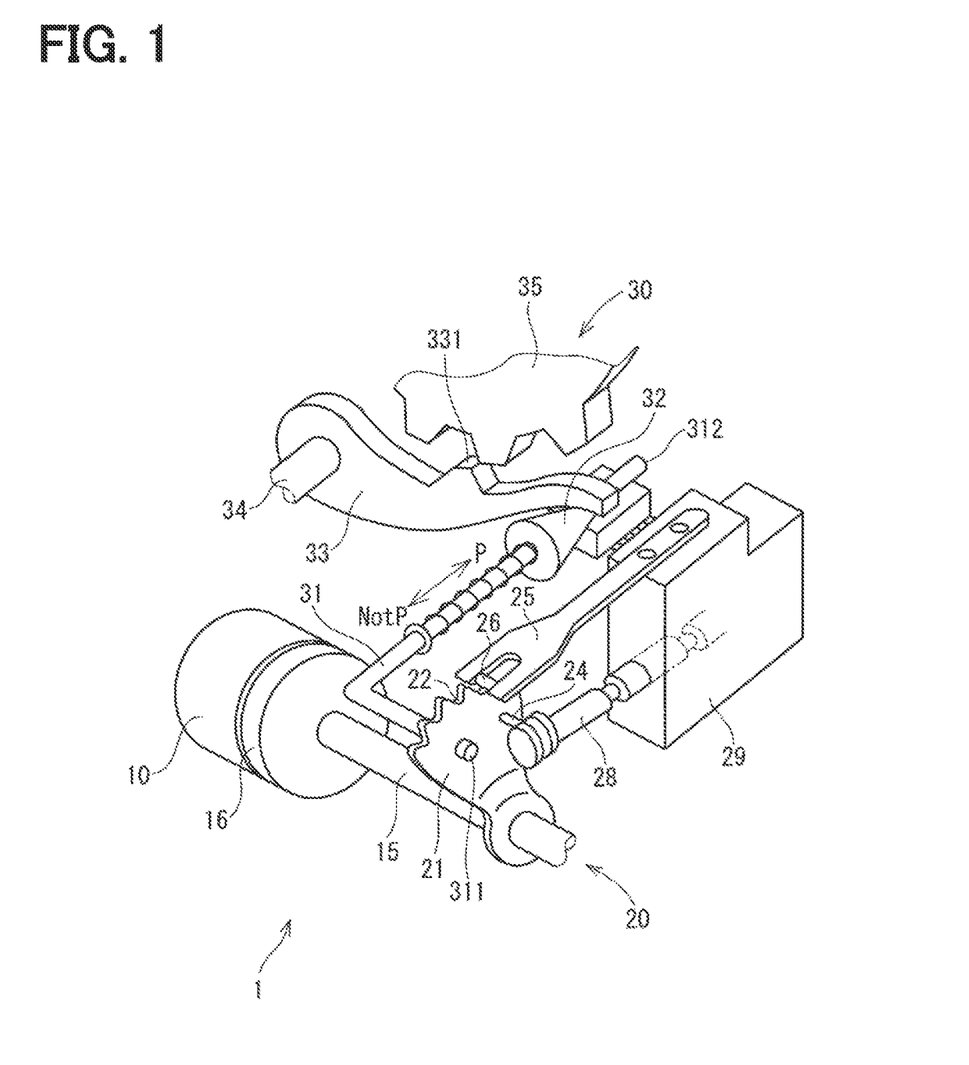
FIG. 1 is a perspective view showing a shift-by-wire system according to a first embodiment.
Figure 2:
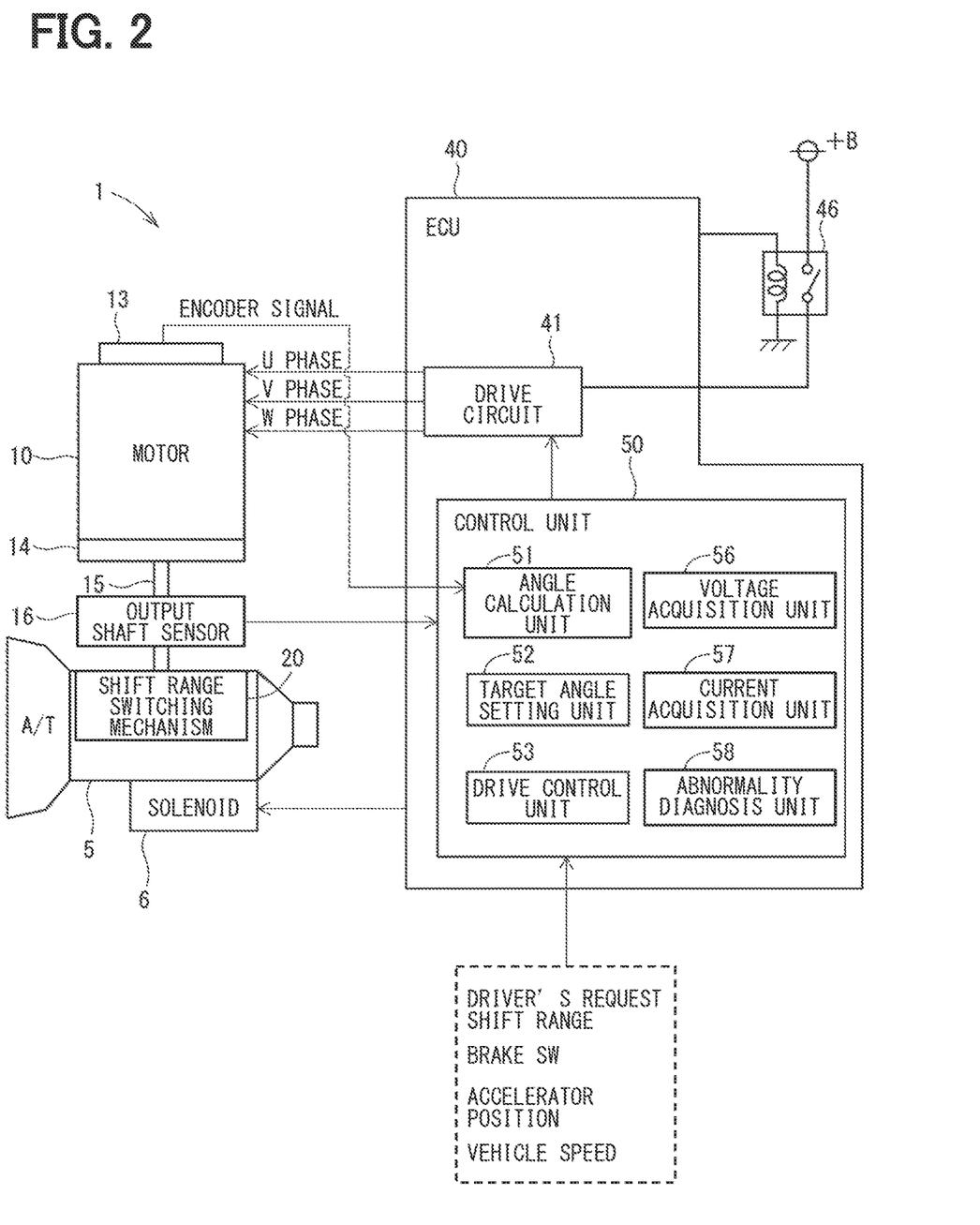
FIG. 2 is a diagram showing a schematic configuration of the shift-by-wire system according to the first embodiment.

Hereinafter, a motor control device will be described with reference to the drawings. Hereinafter, in a plurality of embodiments, a substantially equivalent configuration will be denoted by an identical reference, and explanation thereof will be omitted. The motor control device according to the first embodiment is shown in FIGS. 1 to 7. As shown in FIGS. 1 and 2, a shift-by-wire system 1 includes a motor 10, a shift range switching mechanism 20, a parking lock mechanism 30, an ECU 40 as a motor control device, and the like.

The motor 10 rotates by being supplied with electric power from a battery mounted in a vehicle (not shown), and functions as a drive source for the shift range switching mechanism 20. The motor 10 of the present embodiment is a switched reluctance motor and has a motor winding 11 wound around a stator (not shown). The motor winding 11 has a U-phase winding 111, a V-phase winding 112, and a W-phase winding 113, and is connected by a connection portion 115 (see FIG. 3).

As shown in FIG. 2, an encoder 13, which is a rotation angle sensor, detects a rotation position of a rotor (not shown) of the motor 10. The encoder 13 is, for example, a magnetic rotary encoder and is made up of a magnet that rotates integrally with the rotor, a magnetic detection hall integrated circuit (IC), and the like. The encoder 13 outputs an encoder signal, which is a pulse signal, at predetermined angles in synchronization with the rotation of the rotor.

A speed reducer 14 is provided between a motor shaft of the motor 10 and an output shaft 15 and outputs the rotation of the motor 10 to the output shaft 15 after speed reduction. The rotation of the motor 10 is thus transmitted to the shift range switching mechanism 20. An output shaft sensor 16 for detecting an angle of the output shaft 15 is provided on the output shaft 15. The output shaft sensor 16 is, for example, a potentiometer.

As shown in FIG. 1, the shift range switching mechanism 20 has a detent plate 21, a detent spring 25, a detent roller 26, and the like, and transmits a rotational driving force output from the speed reducer 14 to a manual valve 28 and a parking lock mechanism 30.

The detent plate 21 is fixed to the output shaft 15 and driven by the motor 10. The detent plate 21 has a pin 24 protruding in parallel with the output shaft 15. The pin 24 is connected to the manual valve 28. The detent plate 21 is driven by the motor 10, whereby the manual valve 28 reciprocates in an axial direction. That is, the shift range switching mechanism 20 converts the rotational motion of the motor 10 into a linear motion and transmits the linear motion to the manual valve 28. The manual valve 28 is provided on a valve body 29. When the manual valve 28 reciprocates in the axial direction, a hydraulic supply path to a hydraulic clutch (not shown) is switched, and an engagement state of the hydraulic clutch is switched. In this way, the shift range is switched.

On a detent spring 25 side of the detent plate 21, four valley portions 22 corresponding to the P (parking), R (reverse), N (neutral), and D (drive) ranges are formed.

The detent spring 25 is an elastically deformable plate-like member, and is provided with a detent roller 26 at a tip of the detent spring 25. The detent spring 25 urges the detent roller 26 toward the center of rotation of the detent plate 21. When a rotational force equal to or greater than a predetermined force is applied to the detent plate 21, the detent spring 25 is elastically deformed, and the detent roller 26 moves between the valley portions 22. When the detent roller 26 is fitted into any one of the valley portions 22, the swinging motion of the detent plate 21 is regulated, the axial position of the manual valve 28 and the state of the parking lock mechanism 30 are determined, and the shift range of an automatic transmission 5 is fixed.

The parking lock mechanism 30 includes a parking rod 31, a conical member 32, a parking lock pawl 33, a shaft part 34 and a parking gear 35. The parking rod 31 is formed in a substantially L-shape. The parking rod 31 is fixed to the detent plate 21 on a side of one end 311. The conical member 32 is provided to the other end 312 of the parking rod 31. The conical member 32 is formed to reduce in diameter toward the other end 312.

The parking lock pawl 33 comes into contact with a conical surface of the conical member 32 and is provided so as to be swingable around the shaft part 34. On the parking gear 35 side of the parking lock pawl 33, a protrusion 331 that can mesh with the parking gear 35 is provided. When the conical member 32 moves in a P direction due to the rotation of the detent plate 21, the parking lock pawl 33 is pushed up and the protrusion 331 and the parking gear 35 mesh with each other. On the other hand, when the conical member 32 moves in a NotP direction, the meshing between the protrusion 331 and the parking gear 35 is released.

The parking gear 35 is provided to an axle (not shown) and is enabled to mesh with the protrusion 331 of the parking lock pawl 33. When the parking gear 35 meshes with the protrusion 331, rotation of the axle is restricted. When the shift range is one of the ranges (Not P range) other than the P range, the parking gear 35 is not locked by the parking lock pawl 33. Therefore, the rotation of the axle 95 is not restricted by the parking lock mechanism 30. When the shift range is the P range, the parking gear 35 is locked by the parking lock pawl 33 and the rotation of the axle is restricted.

Figure 3:
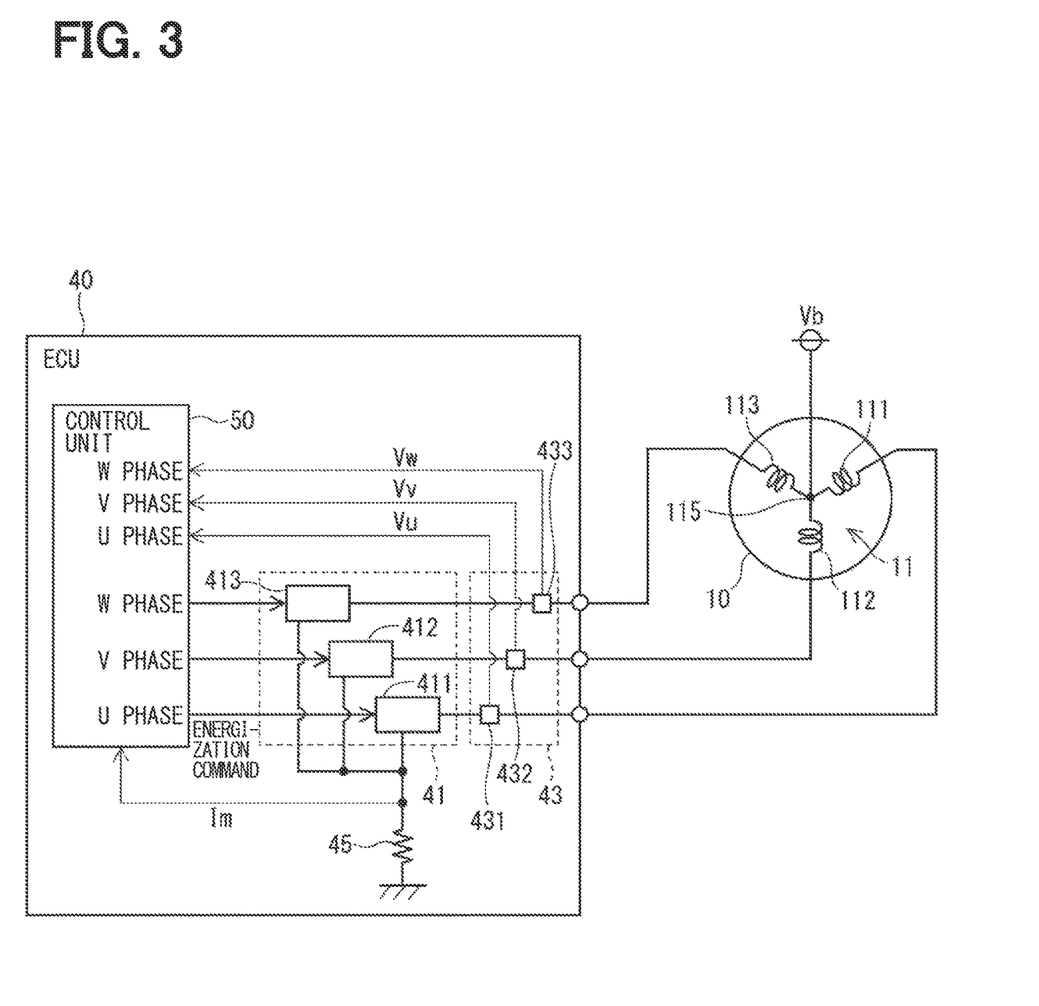
FIG. 3 is a circuit diagram illustrating an ECU according to the first embodiment.

As shown in FIGS. 2 and 3, the ECU 40 includes a driver circuit 41, a voltage detection unit 43, a current detection unit 45, a control unit 50, and the like. In FIG. 2, the description of the voltage detection unit 43 and the current detection unit 45 is omitted. As shown in FIG. 3, the driver circuit 41 has three switching elements 411 to 413, and switches the energization of the windings 111 to 113. The switching elements 411 to 413 of the present embodiment are MOSFETs, and are provided between the windings 111 to 113 of each phase and a ground.

The windings 111 to 113 of the motor winding 11 are connected by a connection portion 115. Power is supplied to the connection portion 115 from the battery via a power supply line. The power line is provided with a relay portion 46 (see FIG. 2), and power is supplied to the connection portion 115 when the relay portion 46 is turned on.

The voltage detection unit 43 includes a U-phase terminal voltage detection unit 431, a V-phase terminal voltage detection unit 432, and a W-phase terminal voltage detection unit 433. The U-phase terminal voltage detection unit 431 detects a U-phase terminal voltage Vu, the V-phase terminal voltage detection unit 432 detects a V-phase terminal voltage Vv, and the W-phase terminal voltage detection unit 433 detects a W-phase terminal voltage Vw. The current detection unit 45 detects the current energized in the motor winding 11. The current detection unit 45 of the present embodiment is a shunt resistor.

The control unit 50 is mainly composed of a microcomputer and the like, and internally includes, although not shown in the figure, a CPU, a ROM, a RAM, an I/O, a bus line for connecting these components, and the like. Each processing executed by each of the control unit 50 may be software processing or may be hardware processing. The software processing may be implemented by causing the CPU to execute a program. The program may be stored beforehand in a memory device such as a ROM, that is, in a computer-readable, non-transitory, tangible storage medium. The hardware processing may be implemented by a special purpose electronic circuit.

The control unit 50 includes an angle calculation unit 51, a target angle setting unit 52, a drive control unit 53, a voltage acquisition unit 56, a current acquisition unit 57, an abnormality diagnosis unit 58, and the like. The angle calculation unit 51 counts pulse edges of each phase of an encoder signal output from the encoder 13, and calculates an encoder count value θen. The encoder count value θen is a value corresponding to the rotation position of the motor 10 and corresponds to a "motor angle".

The target angle setting unit 52 sets a target count value θcmd, which is a target position for stopping the motor 10. When switching the shift range, the target count value θcmd is set so that the detent roller 26 fits into the valley portion 22 according to the target shift range.

The drive control unit 53 is configured to control drive of the motor 10 such that the encoder count value θen becomes a target count value θcmd. Specifically, the drive control unit 53 controls an on/off operation of the switching elements 411 to 413 by generating each phase command and outputting it to the driver circuit 41.

The voltage acquisition unit 56 acquires the terminal voltages Vu, Vv, and Vw from the voltage detection unit 43. The current acquisition unit 57 acquires the voltage on the driver circuit 41 side of the current detection unit 45 as a detection value related to a motor current Im.

In the present embodiment, since the switching elements 411 to 413 are provided on the ground side of the windings 111 to 113, the U-phase terminal voltage Vu becomes a battery voltage Vb when the switching element 411 is off, and becomes a ground potential Vg when the switching element 411 is on. Similarly for the V phase and the W phase, the terminal voltages Vv and Vw become the battery voltage Vb when the switching elements 412 and 413 are off, and becomes the ground potential Vg when the switching elements 412 and 413 are on. Hereinafter, it is assumed that the ground potential Vg is 0.

The abnormality diagnosis unit 58 diagnoses an abnormality in the shift-by-wire system 1. The abnormality of the shift-by-wire system 1 includes an encoder abnormality which is an abnormality of the encoder 13 and an abnormality of the energization system. In the present embodiment, as an abnormality of the energization system, a conduction failure abnormality due to an open failure of the switching elements 411 to 413 will be described. It should be noted that the conduction failure abnormality is not limited to the abnormality of the switching elements 411 to 413 itself, but also includes the signal abnormality and the battery short circuit of the windings 111 to 113 of each phase. Hereinafter, the abnormality determination for U-phase will be mainly described.

By the way, for abnormalities that cannot be detected without energization, such as conduction failure abnormality, when the abnormal detection is performed when it is not necessary to drive the motor 10, it is not possible to detect the abnormality in real time, so there is a risk of erroneous determination when the motor 10 temporarily returns to normal. Further, when the encoder count value θen is stagnant during the shift range switching, it is not possible to determine whether or not the shift range can be switched unless it is possible to determine whether the encoder 13 is abnormal or the continuity is impossible.

Therefore, in the present embodiment, when the encoder count value θen is stagnant during the shift range switching, it is determined whether the encoder is abnormal or the continuity is impossible. Specifically, when the energization indicating phase when the encoder count value θen is stagnant is the U phase, if the U phase terminal voltage Vu is 0, the energization system is normal and it is determined that the encoder is abnormal. In this case, since the energization system is normal, the motor 10 is driven by the open drive for switching the energization phase at predetermined time intervals without using the encoder count value θen, and the range switching is continued.

Further, when the energized phase when the encoder count value θen is stagnant is the U phase, if the U phase terminal voltage Vu is the battery voltage Vb, it is determined that the U phase is conduction failure abnormality, and the energization to the motor 10 is turned off. By turning off the energization of the motor 10, the detent roller 26 is dropped into the nearest valley portion 22 by the load torque. Hereinafter, the case where the faulty phase is the U phase and the normal phase is the V phase and the W phase will be described as an example.

Figure 4:
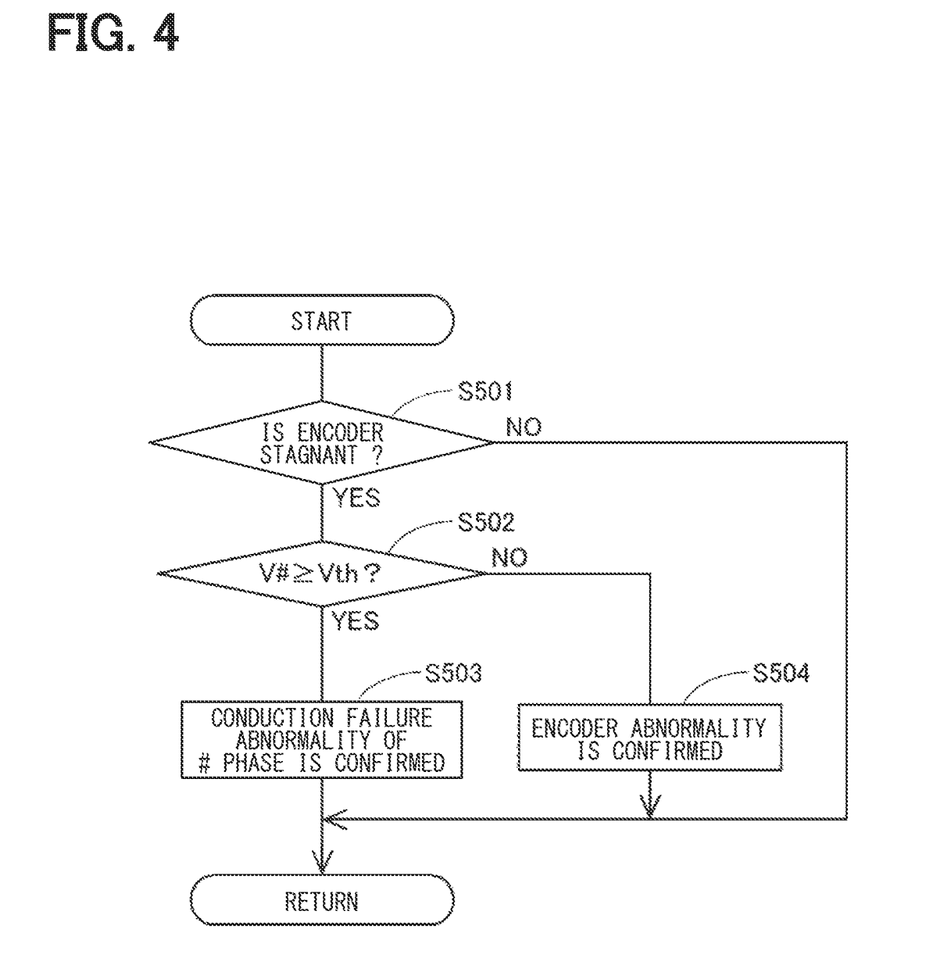
FIG. 4 is a flowchart illustrating an abnormality detection process according to the first embodiment.

The abnormality detection process of the present embodiment will be described with reference to the flowchart of FIG. 4. This process is executed by the abnormality diagnosis unit 58 in a predetermined cycle (for example, 1 [ms]) when the drive mode is the feedback mode. Hereinafter, a "step" of step S501 is omitted, and is simply referred to as the symbol "S". The same applies to the other steps.

In S501, the abnormality diagnosis unit 58 determines whether or not the encoder 13 is stagnant. Here, if the encoder count value θen does not change in the determination time or the number of determinations, it is determined that the encoder 13 is stagnant. When it is determined that the encoder 13 is not stagnant (S501: NO), the processes after S502 are skipped. When it is determined that the encoder 13 is stagnant (S501: YES), the process proceeds to S502.

In S502, the abnormality diagnosis unit 58 determines whether or not the terminal voltage V # of the energization indicating phase is equal to or higher than a voltage determination threshold value Vth. If the energization indicating phase is the U phase, the terminal voltage V # is the U phase terminal voltage Vu, and so on, and "#" means the energization indicating phase. Similar to S501, when the state where the terminal voltage V # of the energization indicating phase is equal to or higher than the voltage determination threshold value Vth continues in the determination time or the number of determinations, a positive determination is made. The determination time and the number of determinations may be the same as or different from S501.

The voltage determination threshold value Vth is a value between the ground potential Vg and the battery voltage Vb, and is set to an arbitrary value capable of separating the conduction failure abnormality and the encoder abnormality. When it is determined that the terminal voltage V # of the energization indicating phase is equal to or higher than the voltage determination threshold value Vth (S502: YES), the process proceeds to S503, and the conduction failure abnormality of the energization indicating phase is confirmed. When it is determined that the terminal voltage V # of the energization indicating phase is less than the voltage determination threshold value Vth (S502: NO), the process proceeds to S504 and the encoder abnormality is confirmed.

This drive mode selection process in the present embodiment will be described with reference to a flowchart of FIG. 5. The control unit 50 executes this process at a predetermined cycle (for example, 1 ms) when a vehicle start switch such as an ignition switch is turned on. The fail modes of the present embodiment include a "fail (energization off) mode" for turning off the energization, a "fail (open) mode" for driving the motor 10 by open drive, and a "fail (stop) mode" for stopping the motor 10.

In S101, the control unit 50 determines the current drive mode. When the drive mode is the standby mode, the process proceeds to S102, when it is the feedback mode, the process proceeds to S104. When it is the stop mode, the process proceeds to S110, and when it is the fail (open) mode, the process proceeds to S112. When it is the fail (stop) mode, the process proceeds to S114. Further, in the case of the fail (energization off) mode, the processes after S102 are skipped.

In S102, which shifts to the case where the drive mode is the standby mode, the control unit 50 determines whether or not the target shift range has been changed. If it is determined that the target shift range has not been changed (S102: NO), the standby mode is continued. When it is determined that the target shift range has been changed (S102: YES), the process proceeds to S103 and the drive mode is switched to the feedback mode. In the feedback mode, the drive of the motor 10 is feedback-controlled so that the encoder count value θen becomes the target count value θcmd. The feedback is described as "F/B" as appropriate in the figure.

In S104, which shifts to the case where the drive mode is the feedback mode, the control unit 50 determines whether or not the encoder abnormality is confirmed. When it is determined that the encoder abnormality is confirmed (S104: YES), the process proceeds to S105 and the drive mode is switched to the fail (open) mode. If it is determined that the encoder abnormality has not been confirmed (S104: NO), the process proceeds to S106.

In S106, the control unit 50 determines whether or not the conduction failure abnormality of the energization indicating phase is confirmed. When it is determined that the conduction failure abnormality of the energization indicating phase is confirmed (S106: YES), the process proceeds to S107, the drive mode is set to fail (energization off), and the energization to the motor 10 is turned off. When it is determined that the conduction failure abnormality of the energization indicating phase has not been confirmed (S106: NO), the process proceeds to S108.

In S108, the control unit 50 determines whether or not the motor 10 has reached the target angle. Here, when the encoder count value θen falls within a predetermined range (for example, ±2 counts) including the target count value θcmd, it is determined that the motor 10 has reached the target angle. When it is determined that the motor 10 has not reached the target angle (S108: NO), the feedback mode is continued. When it is determined that the motor 10 has reached the target angle (S108: YES), the process proceeds to S109 and the drive mode is switched to the stop mode. In the stop mode, the motor 10 is stopped by energizing the fixed phase to two phases according to the encoder count value θen.

In S110, which shifts to the case where the drive mode is the stop mode, the control unit 50 determines whether or not the fixed phase energization is completed. Here, when the time during which the fixed phase energization is performed exceeds a predetermined time, it is determined that the fixed phase energization is completed. The predetermined time for continuing the fixed phase energization is set according to the time required to stop the motor 10. When it is determined that the fixed phase energization is not completed (S110: NO), the stop mode is continued. When it is determined that the fixed phase energization is completed (S110: YES), the process proceeds to S111 and the drive mode is switched to the standby mode.

In S112, which shifts to the case where the drive mode is the fail (open) mode, the control unit 50 determines whether or not the motor 10 has reached the target angle. Since the encoder count value θen cannot be used in the fail (open) mode, the number of switching of the energized phase is counted for determination. When it is determined that the motor 10 has not reached the target angle (S112: NO), the fail (open) mode is continued. When it is determined that the motor 10 has reached the target angle (S112: YES), the process proceeds to S113, and the drive mode is switched to the fail (stop) mode. In the fail (stop) mode, the motor 10 is stopped by energizing the fixed phase to two phases.

In S114, which shifts to the case where the drive mode is the fail (stop) mode, the control unit 50 determines whether or not the fixed phase energization is completed, as in S110. If it is determined that the fixed phase energization is not completed (S114: NO), the fail (stop) mode is continued. When it is determined that the fixed phase energization is completed (S114: YES), the process proceeds to S115, the drive mode is switched to fail (energization off), and the energization to the motor 10 is turned off.

Figure 6:
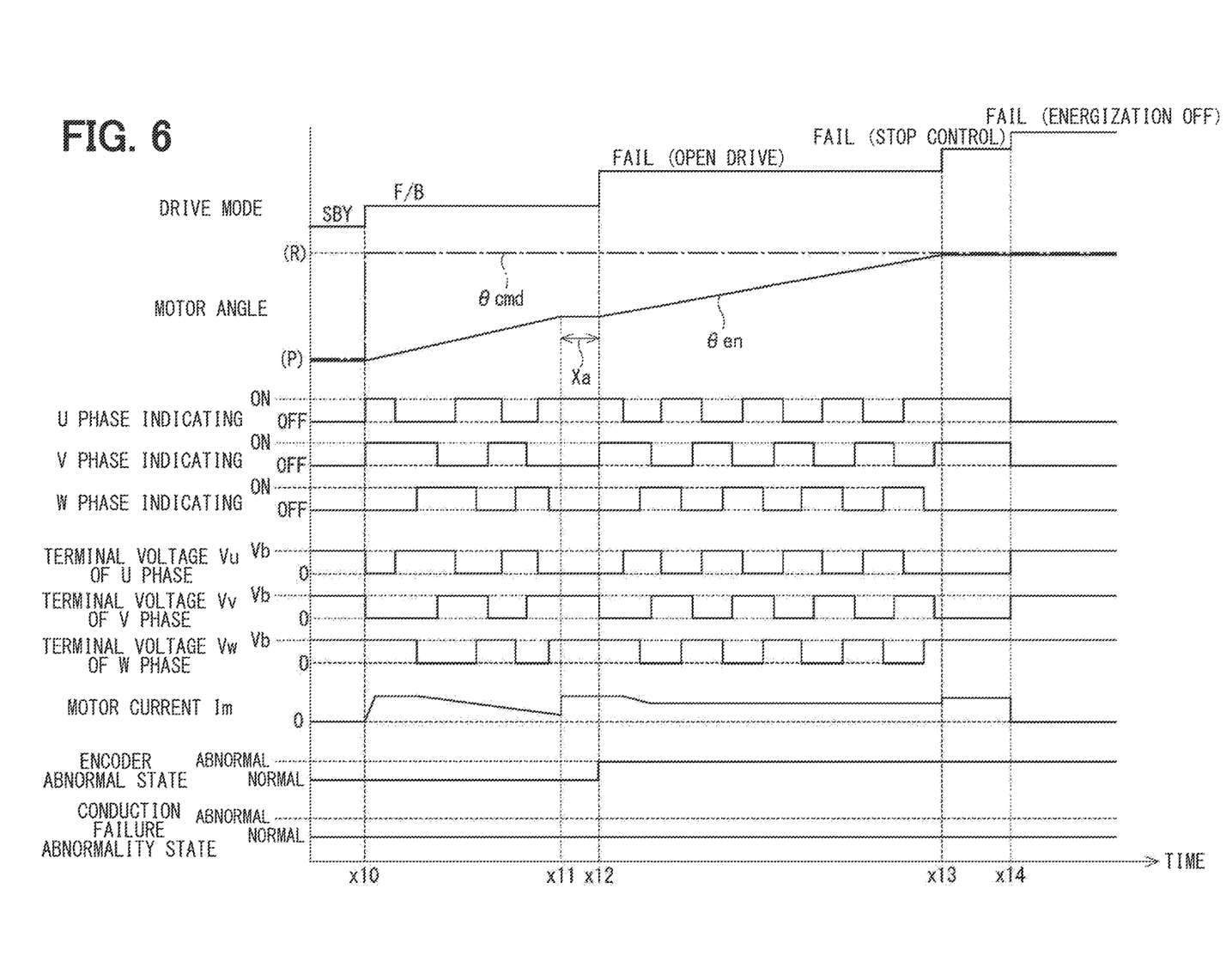
FIG. 6 is a time chart illustrating motor drive control according to the first embodiment.
Figure 7:
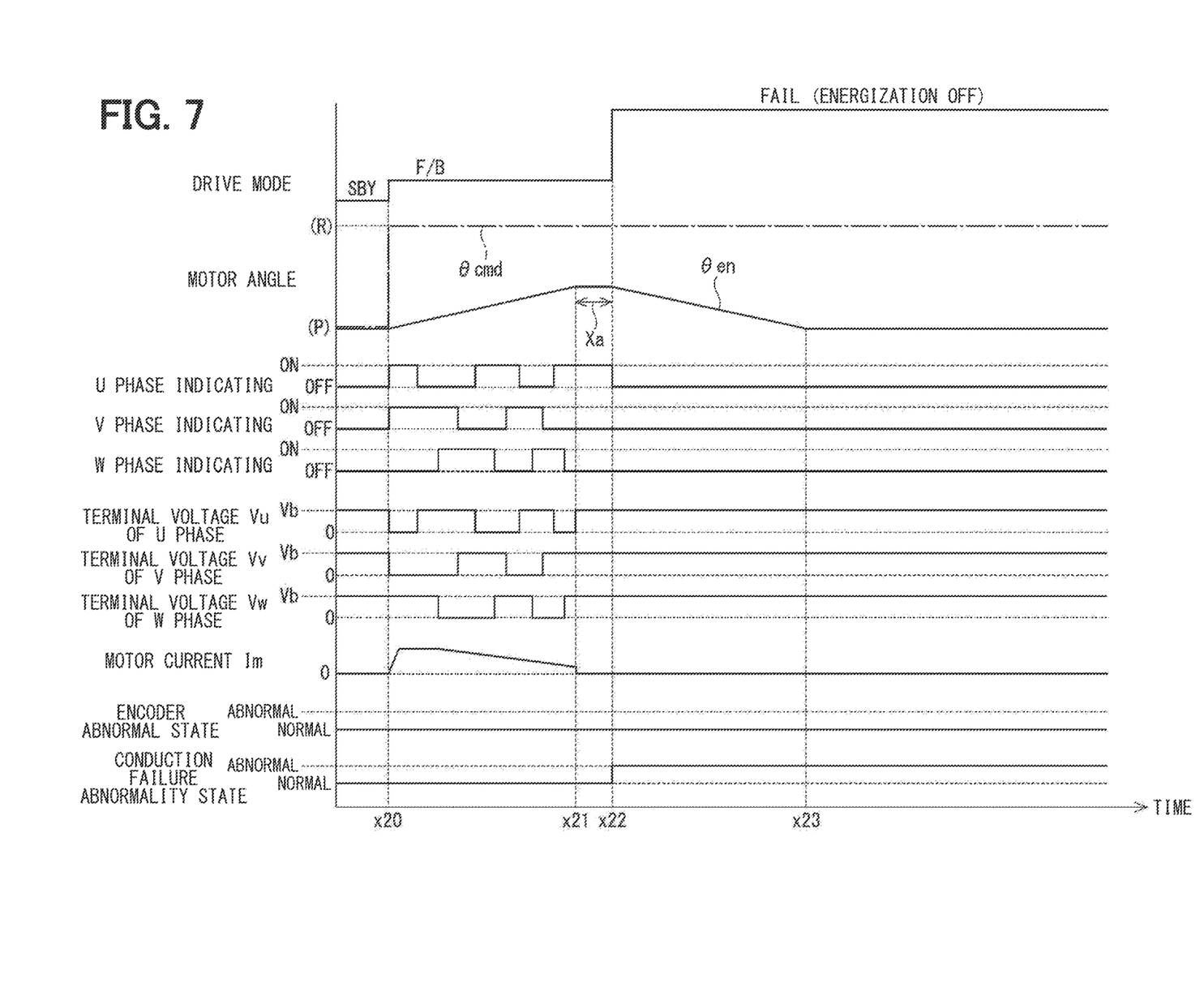
FIG. 7 is a time chart illustrating motor drive control according to the first embodiment.

The motor drive control of the present embodiment will be described with reference to the time charts of FIGS. 6 and 7. FIGS. 6 and 7 show the drive mode, the motor angle, the energization indicating of each phase, the terminal voltage of each phase, the encoder abnormal state, and the conduction failure abnormality state from an upper stage. For the motor angle, the corresponding shift range is described in parentheses. Similar concept is also applicable to FIG. 9 which will be described later.

A case where an encoder abnormality occurs will be described with reference to FIG. 6. As shown in FIG. 6, at time x10, when the target shift range is switched from the P range to the R range, the drive mode is switched from the standby mode to the feedback mode. Further, the target count value θcmd is set so that the detent roller 26 fits into the valley portion 22 corresponding to the R range, and the motor 10 is driven by feedback control so that the encoder count value θen becomes a target count value θcmd. Specifically, the energization phase is switched by switching the energization indicating according to the encoder count value θen. In the present embodiment, in the normal state, the terminal voltage of the phase in which the energization indicating is on becomes 0, and the terminal voltage of the phase in which the energization indicating is off becomes the battery voltage Vb.

The encoder count value θen is stagnant at time x11. At this time, the energization indicating phase is the U phase, the U phase terminal voltage Vu is 0, the motor current Im is not 0, and a current is flowing through the motor winding 11. That is, since no abnormality has occurred in the energization system, the encoder abnormality is confirmed at the time x12 when the determination time Xa has elapsed from the stagnation of the encoder count value θen. Here, the stagnation determination of the encoder 13 and the determination of the energized state are simultaneously determined. For example, the encoder stagnation is determined in a first determination time, and then the energized state is determined in a second determination time.

When the encoder abnormality is confirmed at the time x12, the drive mode is set to the fail (open) mode, the motor 10 is driven by the open drive, and the range switching is continued. When it is determined at time x13 that the motor 10 has reached the target angle based on the number of times the energized phase is switched, the drive mode is switched to the fail (stop) mode, and the motor 10 is stopped by the fixed phase energization. In the example of FIG. 6, the U phase and the V phase are energized. At the time x14 when the fixed phase energization is completed, the drive mode is set to the fail (energization off) mode, and the energization to the motor 10 is stopped.

The case where the conduction failure abnormality occurs in the U phase will be described with reference to FIG. 7. The process from time x20 to time x21 in FIG. 7 is the same as the process from time x10 to time x11 in FIG. 6. At time x21, the encoder count value θen is stagnant and the energization indicating phase is the U phase. The U phase terminal voltage Vu is the battery voltage Vb, the motor current Im is 0, and the current is not flowing through the motor winding 11. That is, it is possible to detect that a non-conducting abnormality in which the U-phase winding 111 cannot be energized has occurred.

At the time x22 when the determination time Xa has elapsed from the time x21, the conduction failure abnormality is confirmed, and the drive mode is switched to the fail (energization off) mode. When the energization of the motor 10 is stopped, the motor 10 rotates in a reverse direction due to the load torque, and the detent roller 26 is returned to the valley portion 22 corresponding to the P range at time x23.

In the present embodiment, when the encoder stagnation occurs, the energized state is maintained, and whether the encoder abnormality or the conduction failure abnormality is distinguished in real time based on the terminal voltage of the energization indicating phase. As a result, if the encoder is abnormal, the open drive is performed, and if the non-conductablity abnormality is determined, the energization is turned off, so that appropriate measures can be taken according to the generated abnormality.

As described above, the ECU 40 of the present embodiment controls the drive of the motor 10 having the motor winding 11, and includes the angle calculation unit 51, the drive control unit 53, and the abnormality diagnosis unit 58.

The angle calculation unit 51 acquires a detection value from the encoder 13 that detects the rotation angle of the motor 10, and calculates the encoder count value θen. The drive control unit 53 controls the drive of the motor 10 based on the encoder count value θen. When an abnormality in the encoder count value θen is detected while the motor 10 is being driven, the abnormality diagnosis unit 58 diagnoses the abnormality of the energization system while maintaining the energized state.

Thereby, it is possible to appropriately distinguish whether the abnormality of the encoder count value θen generated during the driving of the motor is an abnormality of the encoder 13 or an abnormality of the energization system. Further, the subsequent control can be appropriately performed according to the abnormal state. For example, when applied to the shift-by-wire system 1, abnormality diagnosis can be performed more quickly compared with the case where the abnormality determination is performed after range switching is completed.

The abnormality diagnosis unit 58 determines whether the detected abnormality of the encoder count value θen is due to an abnormality of the encoder 13 or an abnormality of the energization system based on the terminal voltages Vu, Vv, and Vw of the motor winding 11. This makes it possible to appropriately determine the abnormality that has occurred.

When the abnormality of the encoder count value θen is due to the abnormality of the encoder 13, the drive control unit 53 switches to the control not using the encoder count value θen and continues to drive the motor 10. As a result, if the energization system is normal, the driving of the motor 10 can be continued without using the encoder count value θen. Further, in the shift-by-wire system 1, the range can be appropriately switched.

When the abnormality of the encoder count value θen is due to the abnormality of the energization system, the drive control unit 53 turns off the energization of the motor 10. As a result, the driving of the motor 10 can be stopped promptly. Further, in the shift-by-wire system 1, it is possible to return to the range before the occurrence of the abnormality by the load torque.

When the abnormality in the encoder count value θen is detected, the abnormality in the encoder count value θen is due to the abnormality in the energization system if the terminal voltage of the energization command phase, which is the phase indicating energization, is different from the normal state. Therefore, the abnormality diagnosis unit 58 identifies the energization command phase as the failure phase. In this manner, it is possible to appropriately identify the abnormal part.

Second Embodiment

Figure 8:
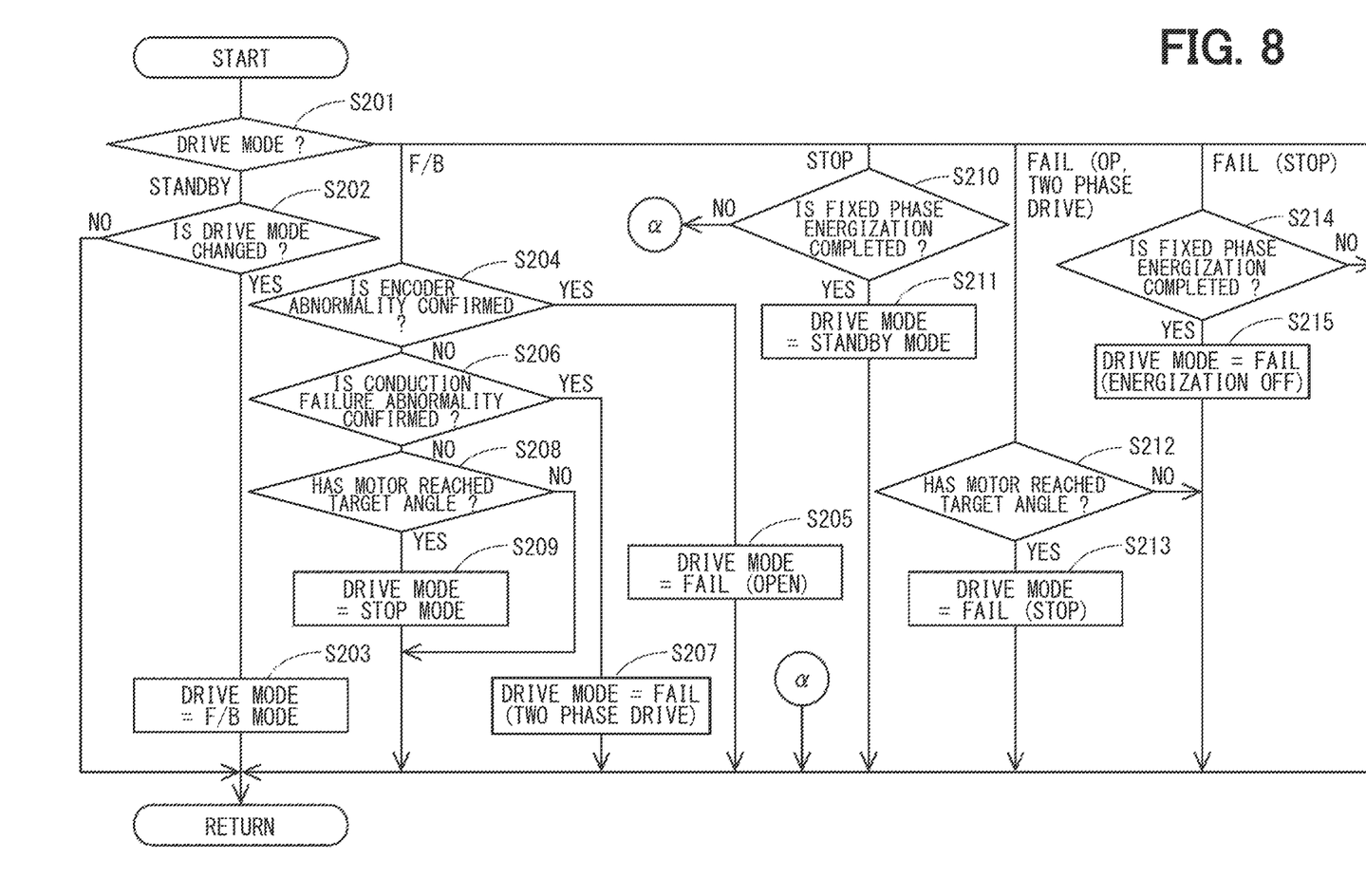
FIG. 8 is a flowchart illustrating a drive mode selection process according to a second embodiment.
Figure 9:
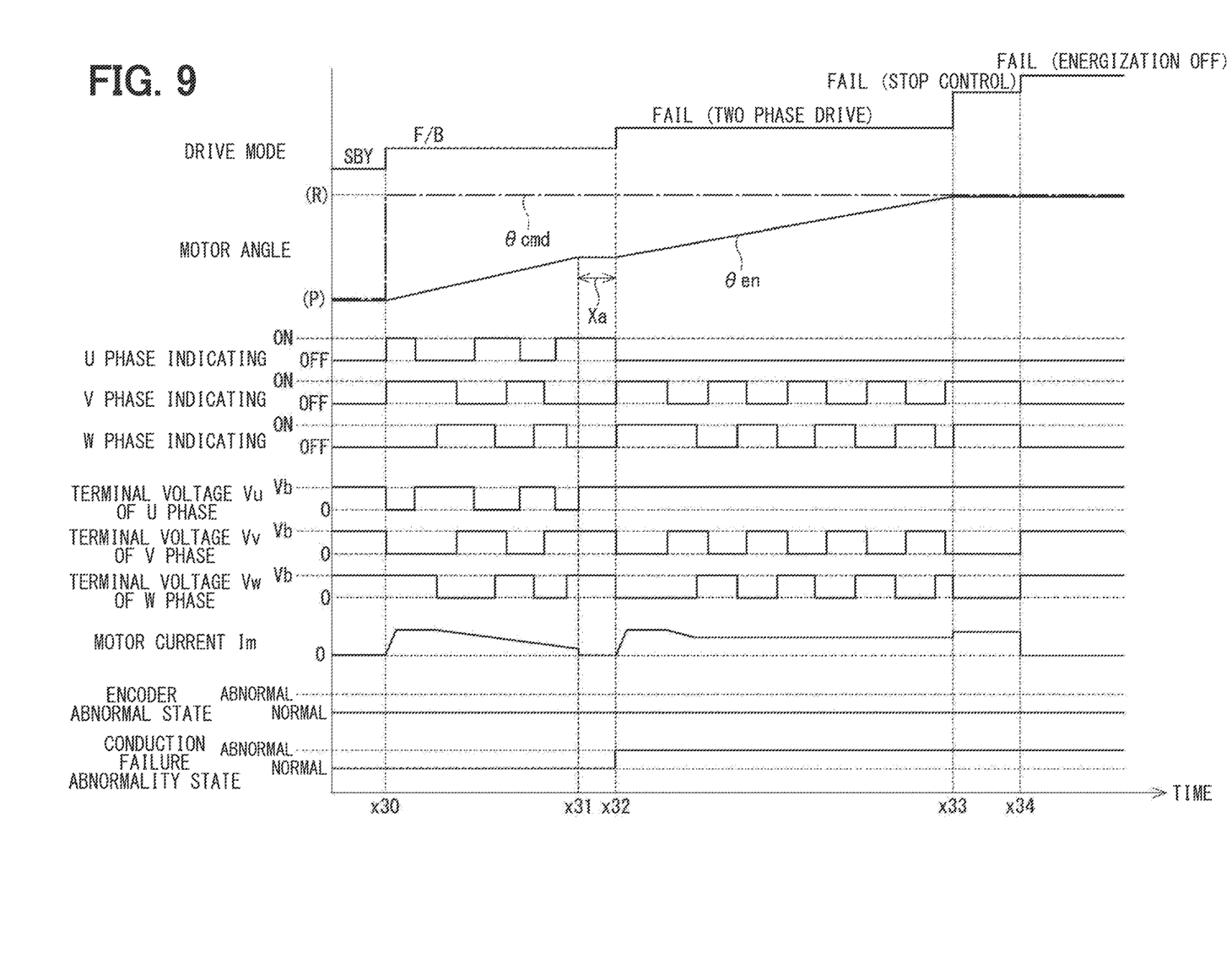
FIG. 9 is a time chart illustrating motor drive control according to the second embodiment.

A second embodiment is shown in FIGS. 8 and 9. In the present embodiment, when the conduction failure abnormality is confirmed, the motor 10 is driven by the two-phase drive using the remaining two phases, and the shift range is switched. The fail mode of the present embodiment includes a fail (two-phase drive) mode in addition to each mode of the above embodiment.

This drive mode selection process in the present embodiment will be described with reference to a flowchart of FIG. 8. In S201, the control unit 50 determines the drive mode. When the drive mode is the standby mode, the process proceeds to S201, when it is the feedback mode, the process proceeds to S204. When it is the stop mode, the process proceeds to S210, and when it is the fail (open) mode and the fail (two-phase drive) mode, the process proceeds to S212.

When it is the fail stop mode, the process proceeds to S214. Further, in the case of the fail (energization off) mode, the processes after S202 are skipped.

Figure 5:
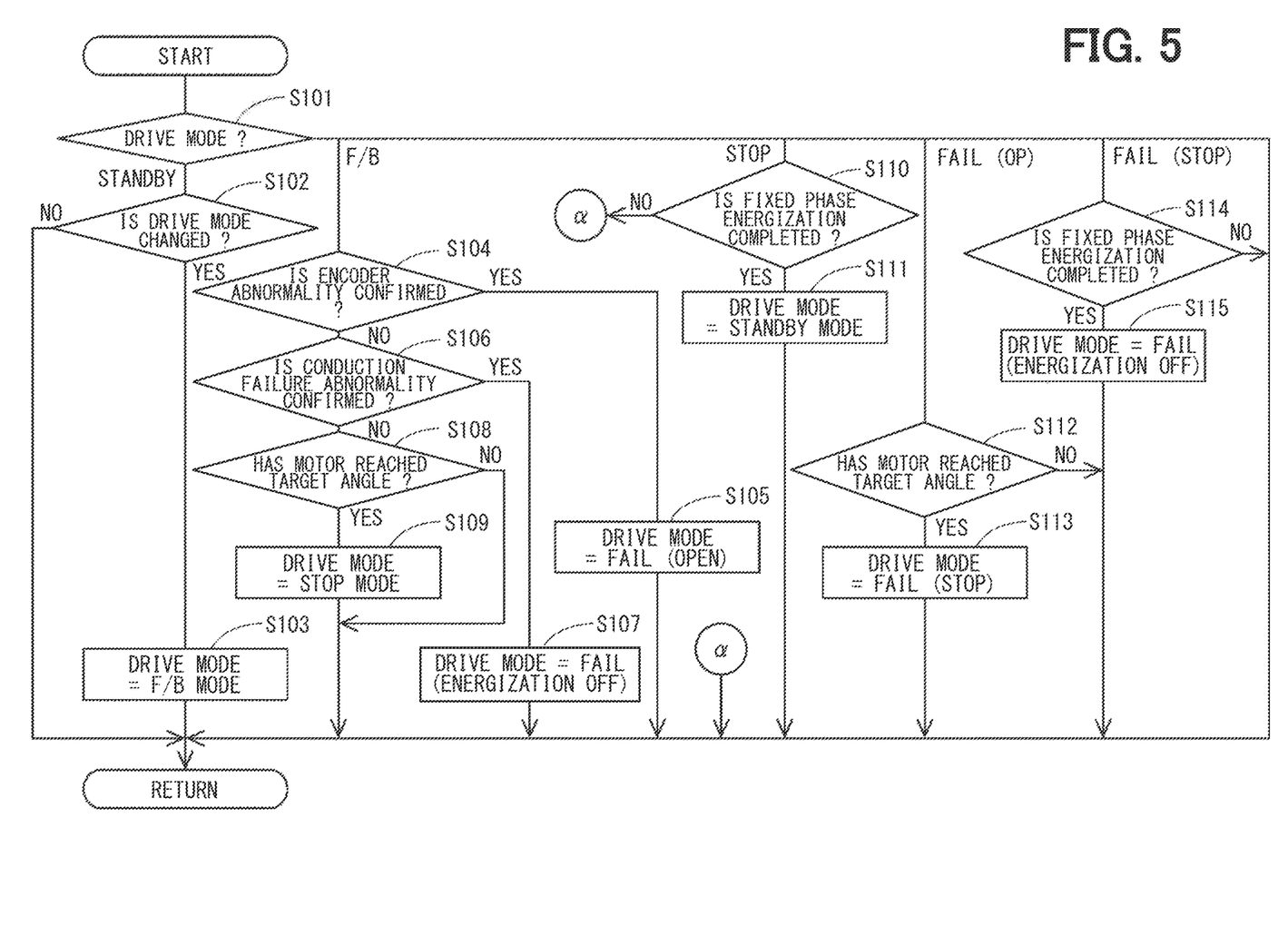
FIG. 5 is a flowchart illustrating a drive mode selection process according to the first embodiment.

The processes of S202 to S206 are the same as the processes of S102 to S106 in FIG. 5. When it is determined in S206 that the conduction failure abnormality is confirmed (S206: YES), the process proceeds to S207 and the drive mode is switched to the fail (two-phase drive). For example, when the conduction failure abnormality occurs in the U phase, the motor 10 is driven by feedback control using two normal phases, the V phase and the W phase, and the shift range is switched.

The processes of S208 to S211 are the same as the processes of S108 to S111 in FIG. 5. In S212, which shifts to the case where the drive mode is the fail (open) mode or the fail (two-phase drive) mode, the control unit 50 determines whether or not the motor 10 has reached the target angle. In the case of two-phase drive, since the encoder 13 is normal, it can be determined based on the encoder count value θen as in S108. When it is determined that the motor 10 has not reached the target angle (S212: NO), the current drive mode is continued, and when it is determined that the motor 10 has reached the target angle (S212: YES), the process proceeds to S213.

In S213, the control unit 50 switches the drive mode to the fail (stop) mode, and stops the motor 10 by energizing the fixed phase to two phases. When the drive mode before the shift to the fail (stop) mode is the fail (two-phase drive) mode, the fixed phase energization to the normal two phases is performed. When the drive mode is the fail (open) mode, the processes of S212 and S213 are the same as the processes of S112 and S113. The processes of S214 and S215 are the same as the processes of S114 and S115.

The motor control process when the conduction failure abnormality occurs in the U phase will be described with reference to the time chart of FIG. 9. The processes of time x30 to time x32 are the same as the processes of time x20 to time x22 in FIG. 7. When the conduction failure abnormality for the U phase is confirmed at time x32, the drive mode is switched to the fail (two-phase drive) mode, and the motor 10 is driven by the two-phase drive using the V phase and the W phase.

When the encoder count value θen reaches the target count value θcmd at time x33, the drive mode is switched to the fail (stop) mode, and the motor 10 is turned on by the fixed phase energization that continues energization to the two phases of V phase and W phase. The process at the time x34 is the same as the process at the time x14 in FIG. 6.

In the present embodiment, the drive control unit 53 does not use the specified failure phase, but switches to control for driving the motor 10 using a normal phase that is a phase other than the failure phase, and continues driving the motor 10. As a result, even if the abnormality occurs in the energization system, the driving of the motor 10 can be continued appropriately. Further, in the shift-by-wire system 1, the range can be appropriately switched. In addition, the same effects as that of the embodiment described above can be obtained.

In the present embodiment, the ECU 40 corresponds to the "motor control device", the encoder 13 corresponds to the "rotation angle sensor", and the encoder count value θen corresponds to the "motor rotation angle".

Other Embodiments

In the above embodiment, the switching element of the driver circuit is provided between the winding of each phase and the ground. In another embodiment, the switching element may be provided on the high potential side of the winding of each phase, or may be provided on both the high potential side and the ground side. Further, the voltage determination threshold value Vth, the magnitude relationship, and the like can be appropriately changed according to the arrangement location of the switching elements.

In the above embodiment, an encoder is used as the rotation angle sensor. In another embodiment, the rotation angle sensor may be a linear sensor such as a resolver as long as it can detect the rotation position of the rotor. In the above embodiment, the potentiometer is exemplified as the output shaft sensor. In other embodiments, the output shaft sensor may be something other than a potentiometer, or the output shaft sensor may be omitted.

In the above embodiment, the motor is a switched reluctance motor. In other embodiments, the motor may be something other than a switched reluctance motor, such as a DC brushless motor. According to the embodiments described above, the four valley portions are formed in the detent plate. As another embodiment, the number of the valley portions is not limited to four but may be any number. For example, the detent plate may have two valley portions and the P range and the NotP range may be switched. The shift range switching mechanism and the parking lock mechanism or the like may be different from those in the embodiments described above. Further, in the above embodiment, the motor control device is applied to the shift range switching system. In other embodiments, the motor control device may be applied to an in-vehicle system other than the shift range switching system, or a motor drive system other than the in-vehicle.

In the above embodiments, the speed reducer is placed between the motor shaft and the output shaft. Although the detail of the speed reducer is not mentioned in the above embodiment, the speed reducer may have any configuration, such as one using a cycloid gear, a planetary gear, or a spur gear that transmits a torque from a speed reduction mechanism substantially coaxial with the motor shaft to the drive shaft, and one using these gears in combination. As another embodiment, the speed reducer between the motor shaft and the output shaft may be omitted, or a mechanism other than the speed reducer may be provided.

The control circuit and method described in the present disclosure may be implemented by a special purpose computer which is configured with a memory and a processor programmed to execute one or more particular functions embodied in computer programs of the memory. Alternatively, the control circuit described in the present disclosure and the method thereof may be realized by a dedicated computer configured as a processor with one or more dedicated hardware logic circuits. Alternatively, the control circuit and method described in the present disclosure may be realized by one or more dedicated computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium. The present disclosure is not limited to the embodiment described above but various modifications may be made within the scope of the present disclosure.

The present disclosure has been described in accordance with embodiments. However, the present disclosure is not limited to this embodiment and structure. This disclosure also encompasses various modifications and variations within the scope of equivalents. Furthermore, various combination and formation, and other combination and formation including one, more than one or less than one element may be made in the present disclosure.

What is claimed is:

1. A motor control device that controls a drive of a motor having a motor winding, comprising:
    a driver circuit having a switching element; and
    a control unit including
    an angle calculation unit configured to acquire a detected value from a rotation angle sensor that detects a rotation angle of the motor so as to calculate the rotation angle of the motor,
    a drive control unit configured to control the drive of the motor based on the motor rotation angle, and
    an abnormality diagnosis unit configured to perform an abnormality diagnosis of an energization system while maintaining an energized state, when an abnormality in the rotation angle of the motor is detected while the motor is being driven, wherein
    the abnormality of the energization system is an abnormality of conduction failure due to an open failure of the switching element; and
    the abnormality diagnosis unit determines whether the detected abnormality of the motor rotation angle is due to an abnormality of the rotation angle sensor or an abnormality of the energization system based on a terminal voltage of the motor winding.

2. The motor control device according to claim 1, wherein when the abnormality of the motor rotation angle is due to the abnormality of the rotation angle sensor, the drive control unit switches to a control not using the motor rotation angle and continues to drive the motor.

3. The motor control device according to claim 2, wherein the drive control unit turns off an energization of the motor when the abnormality of the motor rotation angle is due to the abnormality of the energization system.

4. The motor control device according to claim 2, wherein when the abnormality of the motor rotation angle is detected,
    it is determined that the abnormality in the motor rotation angle is due to the abnormality in the energization system if the terminal voltage of an energization command phase, which is a phase indicating energization, is different from a normal state, and
    the abnormality diagnosis unit identifies the energization command phase as a failure phase.

5. The motor control device according to claim 4, wherein the drive control unit does not use the failure phase, and switches to control for driving the motor using a normal phase that is a phase other than the failure phase so as to continue driving the motor.

6. The motor control device according to claim 1, wherein the drive control unit turns off an energization of the motor when the abnormality of the motor rotation angle is due to the abnormality of the energization system.

7. The motor control device according to claim 1, wherein when the abnormality of the motor rotation angle is detected,
    it is determined that the abnormality in the motor rotation angle is due to the abnormality in the energization system if the terminal voltage of an energization command phase, which is a phase indicating energization, is different from a normal state, and
    the abnormality diagnosis unit identifies the energization command phase as a failure phase.

8. The motor control device according to claim 7, wherein the drive control unit does not use the failure phase, and switches to control for driving the motor using a normal phase that is a phase other than the failure phase so as to continue driving the motor.

9. A motor control device that controls a drive of a motor having a motor winding, comprising:
a driver circuit having a switching element; and
a control unit includes
a computer including a processor and a memory that stores instructions configured to, when executed by the processor, cause the processor to
acquire a detected value from a rotation angle sensor that detects a rotation angle of the motor so as to calculate the rotation angle of the motor,
control the drive of the motor based on the motor rotation angle,
perform an abnormality diagnosis of an energization system while maintaining an energized state, when an abnormality in the rotation angle of the motor is detected while the motor is being driven,
determine that the abnormality of the energization system is an abnormality of conduction failure due to an open failure of the switching element; and
determine whether the detected abnormality of the motor rotation angle is due to an abnormality of the rotation angle sensor or an abnormality of the energization system based on a terminal voltage of the motor winding.

* * * * *